(12) United States Patent
Rayaprolu et al.

(10) Patent No.: US 12,431,205 B2
(45) Date of Patent: Sep. 30, 2025

(54) ADAPTIVE CALIBRATION FOR THRESHOLD VOLTAGE OFFSET BINS

(71) Applicant: MICRON TECHNOLOGY, INC., Boise, ID (US)

(72) Inventors: Vamsi Pavan Rayaprolu, Santa Clara, CA (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 231 days.

(21) Appl. No.: 18/204,189

(22) Filed: May 31, 2023

(65) Prior Publication Data

US 2023/0395170 A1     Dec. 7, 2023

Related U.S. Application Data

(60) Provisional application No. 63/347,836, filed on Jun. 1, 2022.

(51) Int. Cl.
*G11C 16/34*     (2006.01)
(52) U.S. Cl.
CPC .............. *G11C 16/3495* (2013.01)
(58) Field of Classification Search
CPC ................................. G11C 16/3495
See application file for complete search history.

(56) References Cited

U.S. PATENT DOCUMENTS

| 11,217,320 | B1* | 1/2022 | Sheperek | G11C 16/30 |
| 2022/0084605 | A1* | 3/2022 | Muchherla | G11C 16/34 |
| 2022/0277798 | A1* | 9/2022 | Muchherla | G11C 29/028 |
| 2022/0301652 | A1* | 9/2022 | Muchherla | G11C 16/349 |
| 2022/0334752 | A1* | 10/2022 | Muchherla | G06F 3/0655 |
| 2022/0336023 | A1* | 10/2022 | Muchherla | G11C 16/102 |
| 2023/0195355 | A1* | 6/2023 | Shukla | G06F 11/073 |
| | | | | 711/154 |
| 2023/0195379 | A1* | 6/2023 | Kientz | G06F 3/0658 |
| | | | | 711/154 |

* cited by examiner

*Primary Examiner* — Alexander Sofocleous
*Assistant Examiner* — Duy H Luong
(74) *Attorney, Agent, or Firm* — Lowenstein Sandler LLP

(57) ABSTRACT

A system includes a memory device and a processing device, operatively coupled with the memory device, to perform operations including: determining whether a program erase cycle count associated with a segment of the memory device satisfies a first threshold criterion for triggering an offset bin update; responsive to determining that the program erase cycle count satisfies the first threshold creation, performing a calibration measurement of a center of a voltage valley for each state of each cell in the segment of the memory device; and updating a threshold voltage offset bin associated with the segment of the memory device based on a result of the calibration measurement.

20 Claims, 8 Drawing Sheets

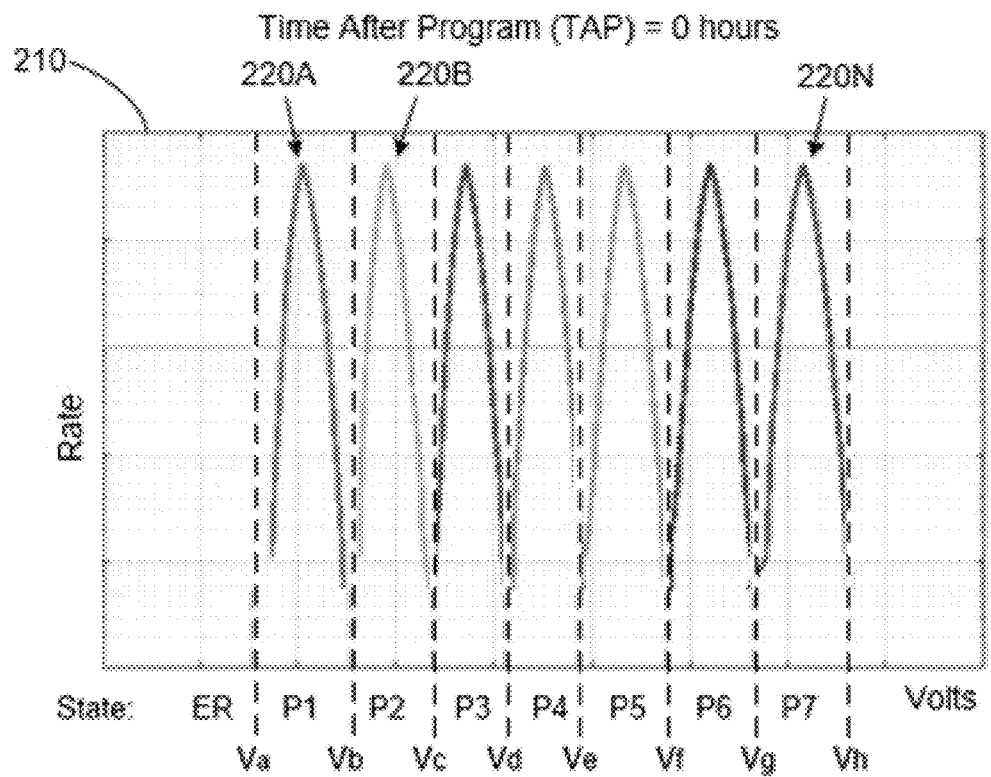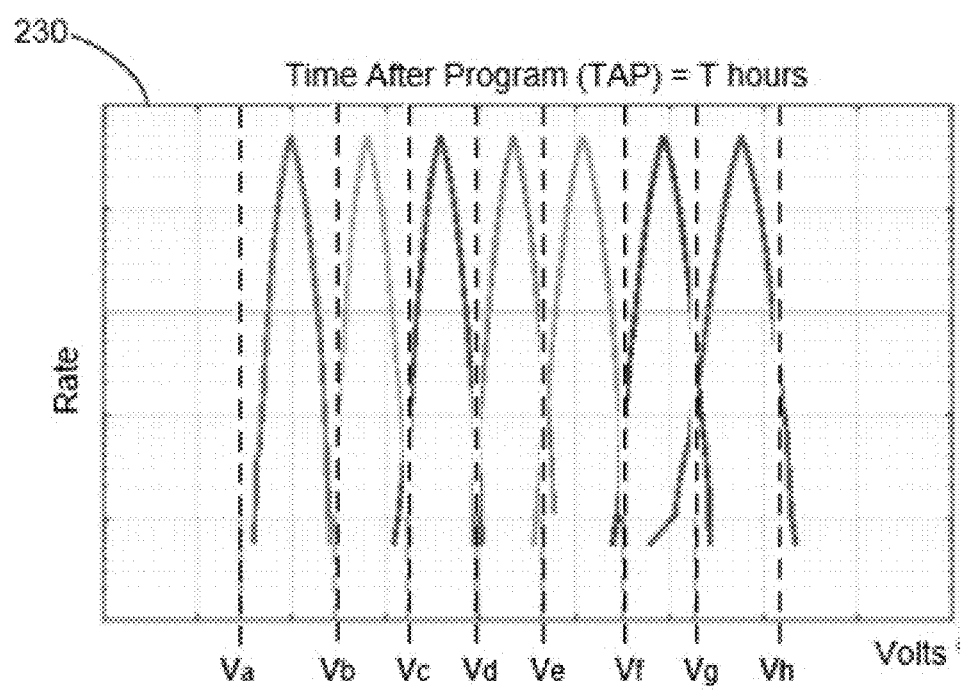
FIG. 2A (PRIOR ART)

| Set-N 301 | | | | | | | | |
|---|---|---|---|---|---|---|---|---|
| | | Bins 303 | | | | | | |
| | | 0 | 1 | 2 | 3 | 4 | 5 | 6 | 7 |
| Valleys 305 | 1 | a | c | c | d | d | e | f | g |
| | 2 | b | d | e | f | g | h | i | j |
| | 3 | d | e | f | g | h | i | j | k |
| | 4 | l | m | n | o | p | q | r | s |
| | 5 | m | n | o | s | s | t | t | u |
| | 6 | u | u | v | w | w | x | y | y |
| | 7 | v | v | w | w | x | y | z | z |

Determine whether a program erase cycle count associated with a segment of the memory device satisfies a first threshold criterion for triggering an offset bin update
410

Responsive to determining that the program erase cycle count satisfies the first threshold criterion, perform a calibration measurement of a center of a voltage valley for each state of each cell in the segment of the memory device
420

Update a threshold voltage offset bin associated with the segment of the memory device based on a result of the calibration measurement
430

```
┌─────────────────────────────────────────────────────┐
│ Determine whether a parameter associated with a     │
│ segment of the memory device satisfies a threshold  │
│ criterion for triggering an offset bin update       │
│                       610                           │
└─────────────────────────────────────────────────────┘
                          │
                          ▼
┌─────────────────────────────────────────────────────┐
│ Responsive to determining that the parameter        │
│ satisfies the threshold creation, perform a         │
│ calibration measurement of a center of a voltage    │
│ valley for a state of each cell in the segment of   │
│ the memory device                                   │
│                       620                           │
└─────────────────────────────────────────────────────┘
                          │
                          ▼
┌─────────────────────────────────────────────────────┐
│ Update a threshold voltage offset bin associated    │
│ with the segment of the memory device based on a    │
│ result of the calibration measurement               │
│                       630                           │
└─────────────────────────────────────────────────────┘
```

FIG. 6

ADAPTIVE CALIBRATION FOR THRESHOLD VOLTAGE OFFSET BINS

RELATED APPLICATIONS

The present application claims the benefit of U.S. Provisional Patent Application No. 63/347,836, filed Jun. 1, 2022, entitled "ADAPTIVE CALIBRATION FOR THRESHOLD VOLTAGE OFFSET BINS," which is incorporated by reference herein.

TECHNICAL FIELD

Embodiments of the disclosure relate generally to memory sub-systems, and more specifically, relate to adaptive calibration for threshold voltage offset bins.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A schematically illustrates the temporal voltage shift caused by the slow charge loss exhibited by triple-level memory cells, in accordance with some embodiments of the present disclosure.

FIG. 3 is an example of a set of threshold voltage offset bins as determined in accordance with some embodiments of the present disclosure.

FIGS. 4-6 are flow diagrams of example methods to update read level voltage offsets for a set of threshold voltage offset bins, in accordance with some embodiments of the present disclosure.

DETAILED DESCRIPTION

Figure 1:
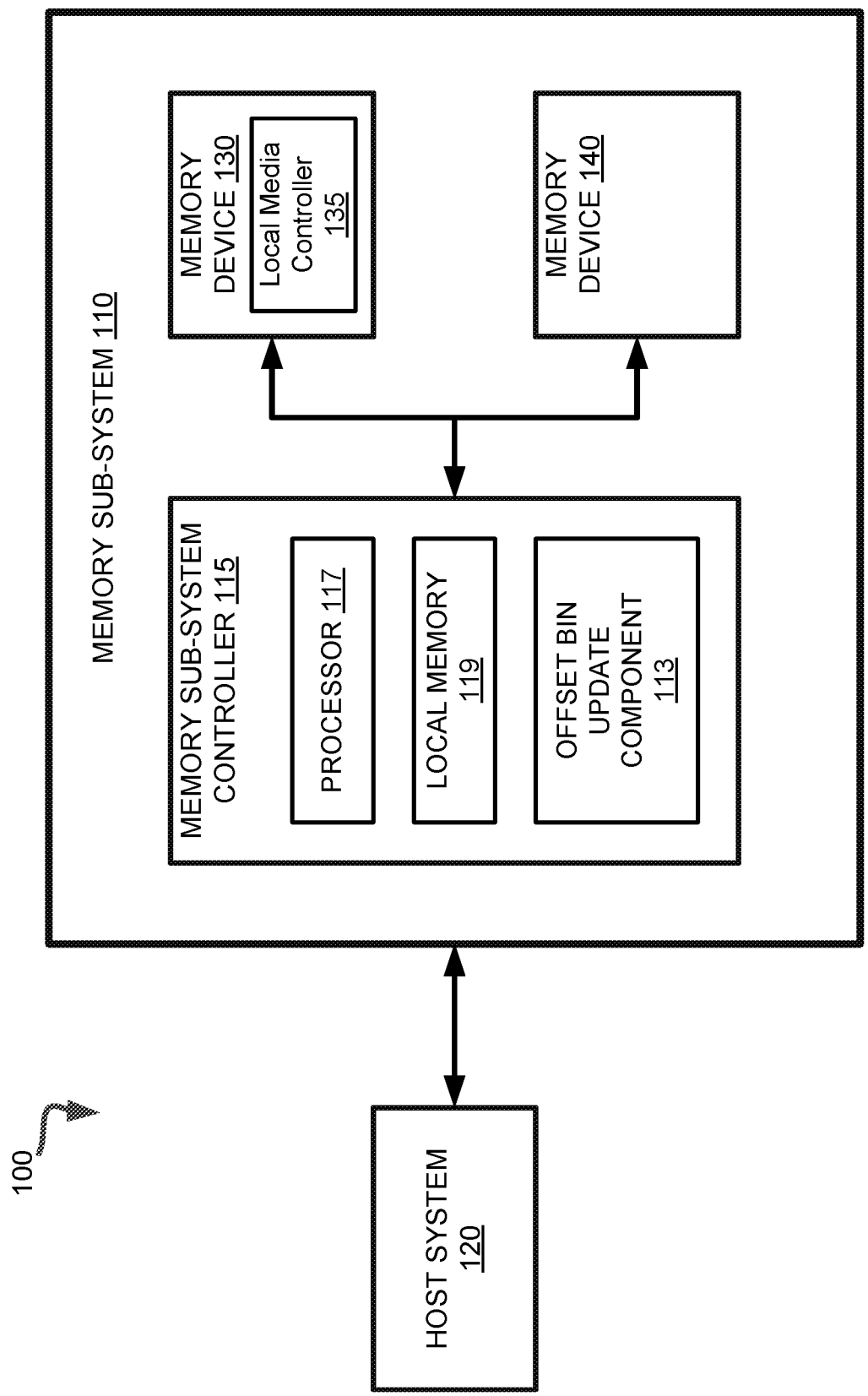
FIG. 1 illustrates an example computing system that includes a memory sub-system in accordance with some embodiments of the present disclosure.

Aspects of the present disclosure are directed to adaptive calibration for threshold voltage offset bins. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device includes multiple memory cells capable of storing, depending on the memory cell type, one or more bits of information. One type of cell is a single level cell (SLC), which stores 1 bit per cell and defines 2 logical states ("states") ("1" or "L0" and "0" or "L1") each corresponding to a respective $V_T$ level. Another type of cell is a multi-level cell (MLC), which stores 2 bits per cell and defines 4 states ("11" or "L0", "10" or "L1", "01" or "L2" and "00" or "L3") each corresponding to a respective $V_T$ level. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

Various data operations (e.g., write, read, erase, etc.) can be performed by the memory sub-system. A memory cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell. Valleys can be located between pairs of adjacent programming distributions. A valley can refer to an area or a region between a pair of adjacent programming distributions. The relative width of a valley can be approximated by valley margin. Valley margin can refer to a relative width or relative margin between pairs of adjacent programming distributions. Valley margin can refer to an absolute measurement in volts (e.g., millivolts (mV)) between two adjacent programming distributions.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device ("read level threshold").

A continuous read level calibration (cRLC) operation is a read level calibration that can be performed to keep each read level threshold centered so that the memory component can achieve the best overall bit error rate (BER) possible. A memory cell (or memory component, etc.) that is calibrated by cRLC has a center value that corresponds to a read level threshold (or read level trim) that is centered in or at a lowest point in the read threshold valley and results in a lowest bit error rate (BER). BER can refer to a ratio of a number of bits in error of a data vector divided by a total number of bits for the given data vector. A trim can refer to digital value that is used for a circuit, such as a register, which is converted into an analog voltage value. For example, the read level threshold trims can be programmed into a read level threshold register, which produces a read level threshold voltage used to read data from a memory cell. The cRLC operation can be performed for each of the multiple read level threshold registers used during all read operations.

The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). As such, the cRLC operation is generally performed on all blocks of a memory system.

Due to the phenomenon known as slow charge loss (SCL), the threshold voltage $V_T$ of a memory cell can change with time as the electric charge of the cell is diminishing, the process sometimes referred to as "temporal voltage shift" (TVS). TVS can include different components such as intrinsic charge loss, system charge loss, quick charge loss, etc. TVS generally increases with increasing number of by Program Erase Cycles (PEC), higher temperatures, and higher program voltages. TVS can show significant die-to-die variation. Since typical cells store negatively charged particles (electrons), the loss of electrons causes the threshold voltages to shift along the voltage axis towards lower threshold voltages $V_T$. The threshold voltages can change rapidly at first (immediately after the memory cell is programmed) while slowing down at larger times in an approximately log-linear or power-law fashion ($\Delta V_T(t) = -C*t^b$) with respect to the time t elapsed since the cell programming event.

In some memory sub-systems, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \to V_T + \Delta V_T$ where $\Delta V_T$ is negative due to charge loss. Whereas TVS is a continuous process and the compensating for $\Delta V_T(t)$ can be a continuous function of time, adequate accuracy of offsets can be achieved in some embodiments with a discrete number of threshold voltage offset "bins." For example, the voltage offset associated with each threshold voltage offset bin, when applied to the base read level, minimizes error rates, i.e., there is no other threshold voltage offset set for a specific bin that results in lower error rates. However, these threshold voltage offset bins are generally characterized during manufacturing and typically based on median die movement in the worst-case end of life conditions, in which, for example, the lower levels in the threshold voltage offset bins are static and only the highest level is measured for the characterization. As described above, the cRLC results and the threshold voltage offset bins are traditionally static during the life of the memory device and cannot be adjusted according to workload and/or environment changes.

Aspects of the present disclosure address the above-referenced and other deficiencies by implementing a memory sub-system that updates threshold voltage offset bins associated with the segment of the memory device (e.g., a die) based on a result of a calibration measurement. The memory sub-system controller can set a threshold criterion for triggering an offset bin update and responsive to the threshold criterion being satisfied, perform the calibration measurement of a center of a voltage valley for each cell in the segment of the memory device (e.g., a die). In one example, the memory sub-system controller can determine a program erase cycle count associated with the segment of the memory device (e.g., a die) and determine whether the program erase cycle count reaches a threshold value. In response, the memory sub-system controller can perform the calibration measurement and update the threshold voltage offset bins based on the calibration measurement. As such, the memory sub-system controller can update all threshold voltage offset bins associated with the segment of the memory device (e.g., a die), taking into consideration the die-to-die variation and the data retention behavior difference between program erase cycles (e.g., from beginning-of-life to end-of-life).

In another example, the memory sub-system controller can determine a workload change or an environment change, such as a temperature change, associated with the segment of the memory device (e.g., a die), determine whether the change reaches a threshold value, and perform the calibration measurement in response to the determination that the change reaches the threshold value. As such, the memory sub-system controller can update all threshold voltage offset bins associated with the segment of the memory device (e.g., a die), taking into the consideration the die-to-die variation, the workload variation, and/or the cross-temperature difference between program and read.

The present disclosure provides a technology improvement to the traditional cRLC that is performed on all blocks of memory devices without adaptive adjustment and without considering the die-to-die variation, the data retention behavior difference between program erase cycles, the workload variation, and/or the cross-temperature difference between program and read. The present disclosure also provides a technology improvement to the threshold voltage offsets that are generated during the development and manufacturing of the memory device and static throughout the life of the memory device, which leads to sub-optimal behavior on certain die that are outliers to begin with, and which does not consider the inconsistent relation between lower levels and the last level varying from die to die.

The present disclosure provides a calibration measurement for adjusting the offset bins using different techniques, for example, depending on a number of bits stored per cell. In one example for QLC, the memory sub-system controller may use parallel auto-read calibration (pARC) read level offsets from host read to calibrate the center of the voltage valley on the fly. In one example for TLC, the memory sub-system controller may use auto-read calibration (ARC) for coarse adjustments and a vectorized read level calibration (vRLC) technique with read sample offsets (RSOs) for fine adjustments. These adjustments can be performed in the background, and the threshold voltage offsets are constantly updated as the calibration progresses throughout the life of the memory device. The calibration measurement may be triggered every certain program erase cycles, at a threshold change of workload, or at a threshold change of temperature.

Advantages of the present disclosure include, but are not limited to, reducing system error rates and improving overall quality of service (QoS) by constantly updating threshold voltage offset bins, thus improving bin calibration. By adjusting the threshold voltage offset bins associated with a segment of the memory device, aspects of the present disclosure improves trigger rate when error rates are too high to trigger to store to new location, and improve QoS loss due to mismatch between offsets and memory devices. Since the calibration process can be triggered upon a temperature change or a workload change, aspects of the present disclosure also helps with the cross-temperature effect and the data retention trigger rates. Updating the offset bins with calibration measurement using different triggering mechanism allows for customized offsets for a specific die with a specific program erase cycle, a specific temperature change, or a specific workload change. Customized offsets may reduce the error rates, and free up error-recovery related resources to be used for other operations, thus reducing the latency and improving the system performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an offset bin update component 113 that can determine whether a parameter associated with a segment of the memory device satisfies a threshold criterion for triggering an offset bin update in order to perform a calibration measurement of a center of a voltage valley for a state of each cell in the segment of the memory device and update a threshold voltage offset bin associated with the segment of the memory device based on a result of the calibration measurement. In some embodiments, the memory sub-system controller 115 includes at least a portion of the offset bin update component 113. In some embodiments, the offset bin update component 113 is part of the host system 110, an application, or an operating system. In other embodiments, local media controller 135 includes at least a portion of offset bin update component 113 and is configured to perform the functionality described herein.

The offset bin update component 113 can determine a parameter associated with a segment of the memory device and determine the parameter-associated threshold criterion for triggering an offset bin update. In one embodiment, the parameter associated with the segment of the memory device may be the PEC count, and the parameter-associated threshold criterion may involve comparing the PEC count with a threshold value. In one embodiment, the parameter associated with the segment of the memory device may be the workload change or the temperature change, the parameter-associated threshold criterion may involve comparing a value representing the workload change and/or the temperature change with a threshold value. In one embodiment, the parameter associated with the segment of the memory device may include the PEC count, the workload change, the temperature change, or any combination thereof, and the parameter-associated threshold criterion may involve the related comparisons described above.

The offset bin update component 113 can perform, for each state or each of multiple states of each cell in the segment of the memory device, a calibration measurement of a center of a voltage valley, responsive to that the threshold criterion for triggering an offset bin update is satisfied. The offset bin update component 113 can update one or more, or all of threshold voltage offset bins associated with the segment of the memory device based on a result of the calibration measurement. An example set of read level voltage offset bins is described with respect to FIG. 3. Further details with regards to the operations of the offset bin update component 113 are described below.

FIG. 2A schematically illustrates the temporal voltage shift caused by the slow charge loss exhibited by triple-level memory cells, in accordance with some embodiments of the present disclosure. While the illustrative example of FIG. 2A utilizes triple-level cells, the same observations can be made and, accordingly, the same remedial measures are applicable to single level cells and multi-level cells, as well as any fractional or whole number of bits per cell (e.g., 3.5 bits per cell, etc.), in order to compensate for the slow charge loss.

Each of chart 210 and 230 illustrate program voltage distributions 220A-220N (also referred to as "program distributions" or "voltage distributions" or "distributions" or "levels" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 220A-220N, respectively.

Time After Program (TAP) herein shall refer to the time since a cell has been written and is the primary driver of TVS (temporal voltage shift) along with temperature. TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages need to be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the threshold voltage offsets used to read the memory cells for the dice of the die group are updated and are applied to the base read threshold levels to perform read operations.

Figure 2B:
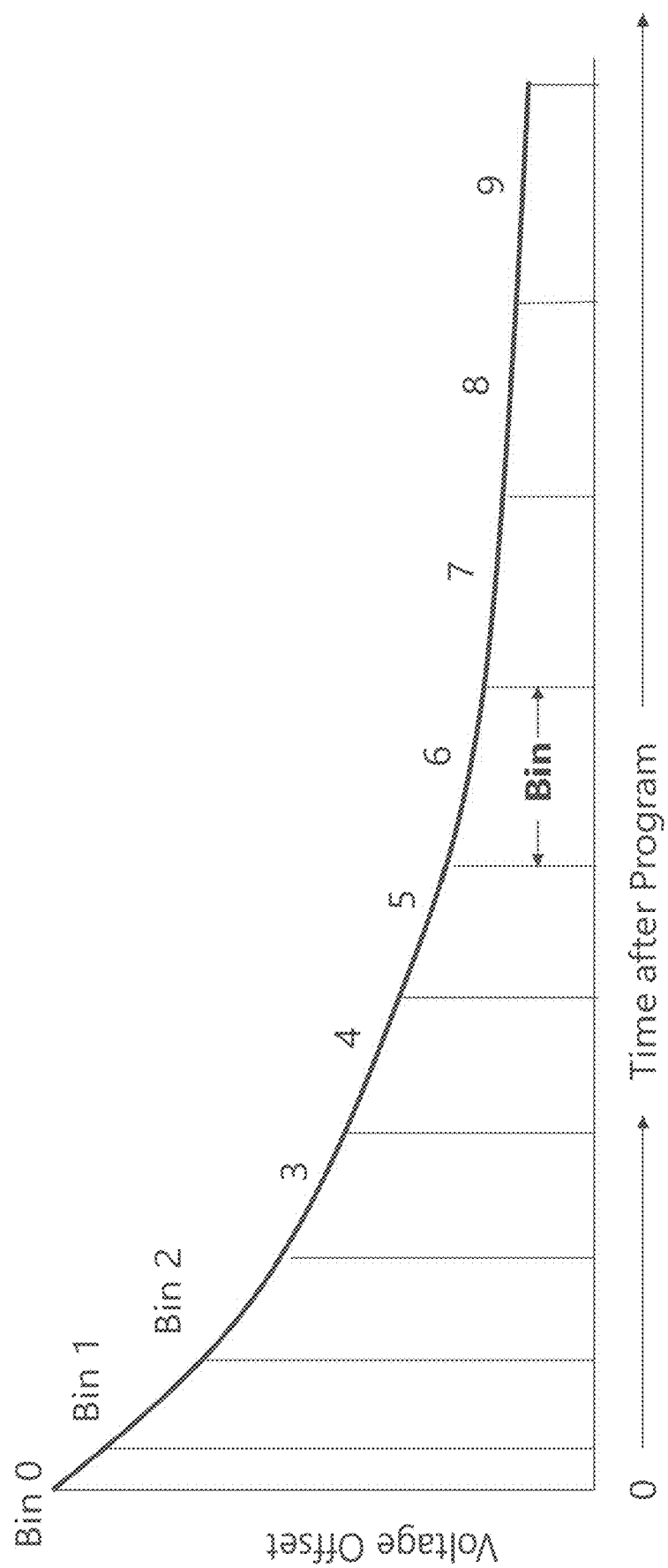
FIG. 2B schematically illustrates a set of predefined threshold voltage offset bins, in accordance with embodiments of the present disclosure.

FIG. 2B schematically illustrates a set of threshold voltage offset bins (bin-0 to bin 9), in accordance with embodiments of the present disclosure. As schematically illustrated by FIG. 2B, the threshold voltage offset graph can be subdivided into multiple threshold voltage offset bins, such that each bin corresponds to a range of threshold voltage offsets. While the illustrative example of FIG. 2B defines ten bins, in other implementations, various other numbers of bins can be employed (e.g., 64 bins).

The memory sub-system controller can associate a segment of memory device (e.g., a die group of a block family) with a threshold voltage offset bin, based on a periodically performed calibration process. The calibration process selects the set of threshold voltage offsets to be applied to the base voltage read level in order to perform read operations. The calibration process involves performing, with respect to a specified number of selected pages or blocks that is being calibrated, read operations utilizing different set of threshold voltage offsets, and choosing the set of threshold voltage offset that results in a defined error rate (e.g., a bit error rate) of the read operation. The defined error rate can be a minimum error rate, or it can be an error rate that falls within a certain range. The threshold voltage offset bin may be determined using different techniques, such as block family error avoidance (BFEA), dynamic pass-through voltage (VpassR), digital failed byte count (CFByte), or charge bucket classifier (CBC) index. That is, a segment of the memory device (e.g., cells, pages, blocks, planes, dies, etc.) can be grouped using different techniques to be associated with one or more of the threshold voltage offset bins.

In one implementation, the threshold voltage offset bin can be determined by a technique of block family error avoidance (BFEA) or similar. According to BFEA, families of blocks (or any other memory partitions) programmed within a specified time window and/or under similar environmental (e.g., temperature) conditions can be associated with one of the threshold voltage offset bins. Given that wear-leveling keeps programmed at similar program-erase cycles (PECs), the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics in terms of temporal voltage shift. A block family may be made with any granularity, containing only whole codewords, whole pages, whole super pages, or whole superblocks, or any combination of these.

Block family creation is the process of opening a block family, maintaining that open block family for a duration, and then closing that block family. In an illustrative example, a new block family can be created ("opened") whenever a specified period of time Δt (e.g., a predetermined number of minutes) has elapsed since creation of the last block family or whenever the reference temperature of memory cells has changed by more than a specified threshold ΔΘ (e.g., 10 C, 20 C, or any other value). Similarly, the family can be "closed" (and a new family can be created) after the time Δt has elapsed since the family was created or if the reference temperature has changed (in either direction) by more than ΔΘ. A memory sub-system controller can maintain an identifier of the active block family, which is associated with one or more blocks as they are being programmed.

The memory sub-system controller can periodically perform a calibration process in order to associate partitions of various families with one of the threshold voltage offset bins. Each threshold voltage offset bin, in turn, can be associated with a set of voltage offsets to be applied for read operations. Upon receiving a read command, the memory sub-system controller can identify the family associated with the memory partition identified by the logical address specified in the read command, identify the current threshold voltage offset bin associated with the identified family, determine a set of read offsets for the identified threshold voltage offset bin, compute the new read voltages by additively applying the read offsets associated with the identified threshold voltage offset bin to the base read levels, and perform the read operation using the new read voltage, as described in more detail below.

The calibration process can evaluate a data state metric (e.g., a voltage shift or bit error rate) for each die of each block family with one of a set of predefined threshold voltage offset bins, e.g., by, for each die of each block family, measuring a value of data state metric of a block (of the block family) stored on the die. The calibration process can then update a bin pointer associated with the die and block family to point to a threshold voltage offset bin that corresponds to the measured value of the data state metric. Each threshold voltage offset bin is in turn associated with voltage offsets to be applied for read operations; for TLC with 8 distributions (levels) there are 7 valleys and for a given threshold voltage offset bin, which includes 7 offsets, one for each valley. For example, the bin pointer can remain the same if the data state metric is in a range associated with the existing bin pointer, or can be changed to point to an older bin if the data state metric is in a range associated with the older bin.

Generally, the temporal voltage shift for younger block families (i.e., block families that are more recently created) is more significant than the temporal voltage shift for older block families (i.e., block families that are less recently created). The memory sub-system controller can periodically perform the calibration process for each block family based on the age of the block family, which corresponds to the threshold voltage offset bin associated with the block family. For example, in an 8 threshold voltage offset bin architecture, newly created block families can be associated with threshold voltage offset bin-0, while the oldest (i.e., least recently created) block families are associated with threshold voltage offset bin 7. The memory sub-system controller performs the calibration process for the block families in threshold voltage offset bin-0 more frequently than for the block families in threshold voltage offset bin 7, based on the age of the block families associated with threshold voltage offset bin-0 (e.g., based on the logarithmic linear nature of SCL). The associations of blocks with block families and block families and dies with threshold voltage offset bins can be stored in respective metadata tables maintained by the memory sub-system controller.

In another implementation, the threshold voltage offset bin can be determined by a block-level detection technique, such as dynamic pass-through voltage (VpassR). In a block-level detection technique, a controller can initiate a block-level read. The controller can then obtain a block-level voltage measurement during the block-level read (e.g., a highest voltage level in the block), determine an amount of charge loss from the block-level voltage measurement, and apply a set of appropriate read level offsets to address the charge loss.

For example, during a read operation of a cell (i.e., a "read cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage ($V_T$) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass-through to the sense amplifier. To achieve this, $V_{pass}R$ can be applied to the wordlines of the unread cells to keep the unread cells activated (i.e., turned on). The magnitude of $V_{pass}R$ is chosen to be greater than the $V_T$'s of the unread cells, but less than a programming voltage. Although $V_{pass}R$ is a lower voltage than the programming voltage, the application of $V_{pass}R$ can affect (e.g., increase) the $V_T$'s and thus alter logic states of the unread cells of the block via tunneling currents. This phenomenon is referred to as "read disturb." As more read operations are applied within the block, the accumulation of read disturb over time lead to read disturb errors.

During dynamic $V_{pass}R$, all wordlines can be ramped up together and a current (e.g., pillar current) can be measured at a power supply voltage (e.g., $V_{REG2}$) until the current is larger than some threshold current value. The $V_T$ of cells connected to a selected wordline ($WL_{sel}$) can be detected directly. For example, cells connected to the unselected wordlines ($WL_{unsel}$) can be ramped to $V_{pass}R$. Then, the cells connected to $WL_{sel}$ can be ramped down to a lower voltage to detect the $V_T$ of those cells. SCL can then be detected if a lower magnitude wordline voltage is needed to meet the threshold current value.

In yet another implementation, the threshold voltage offset bin can be determined by using device-originated metadata, such as a digital failed byte count (CFByte), for adjusting read voltage offset levels used to perform the read operation. For example, the memory sub-system controller can utilize the memory device-originated metadata to select and/or adjust the read voltage level(s) used for each respective wordline of block in a manner that would either minimize the read operation latency while providing at least a specified accuracy of the read operation, or in a manner that would maximize the read operation accuracy while not exceeding a specified latency. In one embodiment, a read strobe operation is performed on the block to identify memory cells having their respective threshold voltages below and/or above the applied read level, and the memory device 130 can, upon performing the read strobe, return metadata values, such as the failed byte count (CFByte) reflecting the number of bytes in the sensed data that have at least one non-conducting bitline. The memory sub-system controller 115 can use the metadata values characterizing the threshold voltage distributions in order to determine the read voltage adjustment values, which can then be utilized for performing the next read strobe. After performing each read strobe, the processing logic can evaluate a chosen data state metric (e.g., RBER) in order to determine whether the sensed data can be successfully decoded or a read voltage adjustment and a subsequent new read strobe are needed. This sequence of calibration and read operations can be iteratively performed until either the sensed data is successfully decoded or a predefined maximum number of steps has been performed. In another embodiment, the memory device 130 could perform the adjustment itself, possibly at the cost of a longer read latency.

In yet another implementation, the threshold voltage offset bin can be determined by using a charge bucket classifier (CBC) index value maintained by the system to determine corresponding read level offsets for the read operation. Based on the amount of time for which the block was open (i.e., the difference between when last wordline was written and the first wordline was written, also referred to herein as the "time to close"), the controller can identify a corresponding CBC index value. Each CBC index value can be associated with a respective range of time to close values for the block, and can have associated defined read level offset values. The CBC index value can be part of a set of predetermined offsets for each level. As the charge loss increases, a higher CBC value (or index) can be chosen to apply larger read level offsets. Thus, the controller can determine the corresponding read level offset values and adjust the read level voltage(s) used to perform the read operation on block accordingly.

FIG. 3 is an example set of read level voltage offsets as determined in accordance with some embodiments of the present disclosure. The bin-offset calibration process determines a set of read level voltage offsets that result in a sub-optimal error rate not exceeding a maximum allowable error rate, thus extending the time period during which a given block family is associated with a particular threshold voltage offset bin. FIG. 3 illustrates an example Set-N 301 of real level voltage offsets. This example set of read level voltage offsets is for a triple level cell (TLC), and thus has 7 valleys 305. Note that a set for a single-level cell (SLC) would have 1 valley, a set for a multi-level cell (MLC) would have 3 valleys, a set for a quad-level cell (QLC) would have 15 valleys, and so on. In the example illustrated in FIG. 3, the set has 8 bins 303. The letters a-z represent read level voltage offsets. Note that letters a-z are an example; the read level voltage offsets can be the same in certain valleys and bins, or they can all be different. There can be more or fewer differing read level voltage offsets than illustrated in FIG. 3 (that is, the read level voltage offsets are not limited to the 26 a-z values illustrated in FIG. 3).

In this example, the memory sub-system controller has determined that read level voltage offset a, when applied to valley 1 of a TLC associated with bin-0, results in a suboptimal error rate not exceeding a maximum allowable error rate; read level voltage offset b, when applied to valley 2 of a TLC associated with bin-0, results in a suboptimal error rate not exceeding a maximum allowable error rate; read level voltage offset d, when applied to valley 3 of a TLC associated with bin-0, results in a suboptimal error rate not exceeding a maximum allowable error rate; and so on. Thus, associating a block family with Set-N 301 can extend the time period during which the block family will be in bin-0, thus reducing the frequency of the calibration process and improving overall system performance. The Set-N 301 of real level voltage offsets are updated in accordance with embodiments of the present disclosure. Further details regarding the updating process are provided with respect to FIGS. 4-6.

FIG. 4 is a flow diagram of an example method 400 to update read level voltage offsets for a threshold voltage offset bin, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the offset bin update component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic may determine whether a program erase cycle (PEC) count associated with a segment of the memory device satisfies a first threshold criterion for triggering an offset bin update. In one embodiment, the processing logic may compare the PEC count with a threshold value. In one implementation, the PEC count satisfies the threshold criterion when the PEC count is greater than or equal to the threshold value. In another implementation, the threshold criterion may include a range of values, and the PEC count satisfies the threshold criterion when the PEC count falls in the range.

In some embodiments, the processing logic may determine the PEC count for a set of target cells. A set of target cells may be defined to have the same PEC count. In one embodiment, memory sub-system controller 115 tracks the PEC count at a certain level of granularity, such as by segment, by memory die, by memory device, etc. Accordingly, offset bin update component 113 can retrieve the PEC count associated with the segment of the memory device including the target cells, such as from a data structure maintained in local memory 119 or elsewhere on memory device 130.

In some embodiments, the processing logic may determine a segment of the memory device associated with a threshold voltage offset bin. The segment of the memory device (e.g., cells, pages, blocks, planes, dies, etc.) can be grouped using different techniques described above to be associated with one of the threshold voltage offset bins. In one implementation, the segment of the memory device may be one or more of the families of blocks (or any other memory partitions) programmed within a specified time window and/or under similar environmental (e.g., temperature) conditions (e.g., BFEA technique or like). In one implementation, the segment of the memory device may be one or more of cells of the blocks for which a lower magnitude wordline voltage is needed to meet a threshold current value (e.g., Dynamic vPassR technique or like). In one implementation, the segment of the memory device may be one or more of blocks having metadata including the number of bytes in the sensed data that have at least one non-conducting bitline (e.g., Digital Cfbyte technique or like). In one implementation, the segment of the memory device may be one or more of blocks having a respective range of "time to close" values (e.g., CBC index technique or like).

At operation 420, responsive to determining that the program erase cycle count satisfies the first threshold criterion, the processing logic may perform a calibration measurement of a center of a voltage valley for each state of each cell in the segment of the memory device. Performing the calibration measurement of a center of a voltage valley may use different measurement methods. Performing the calibration measurement provides appropriate read level adjustment to prevent significant errors that can occur due to charge change mechanisms such as disturbs, retention and SCL that can alter the data Vt voltage distributions stored in the cell. In some embodiments, the measurement method may be selected depending on a number of bits per cell which the segment of the memory device is configured to store. In some embodiments, the measurement method may be changed when the result of the calibration measurement is smaller than or equals to a certain value, such as from coarse measurement to fine measurement.

In one implementation, the segment of the memory device is configured as triple level cell (TLC) memory storing three bits per cell, and the measurement method involves an auto-read calibration (ARC) technique and a vectorized read level calibration (vRLC) technique with read sample offsets (RSOs). The ARC technique can be used as coarse measurement of the center of the voltage valley, and the vRLC technique for RSOs can be used as fine measurement of the center of the voltage valley. Other measurement methods, such as coarse threshold estimation (CTE) can also be used to find the center of a voltage valley. ARC can be implemented as an on-chip command that analyzes the histogram distribution of bits within a valley and aims to converge to the center of the valley. vRLC is an improvement over cRLC and is performed in system firmware or externally to the memory device through repeated RSO reads and aims to find the optimal read position within a valley, leading to the lowest bit error count.

The ARC technique is an internal mechanism that can be done inside the memory device such as NAND, and vRLC is generally performed outside the memory device by the system through a controller. A RSO operation involves performing multiple reads on the data at varying offsets, generally referred to as left, right, and center samples, determining an error count, and identifying an associated bit error rate (BER). Each of these reads of the RSO operation (also referred to as the left strobe, right strobe, and center strobe) is of the same data, with the left sample and the right sample captured at an offset relative to the center sample. Each strobe returns a bit error count (BEC or EC). For example, the center strobe can be a read threshold voltage value, the left strobe can be another read threshold voltage value that is decreased (i.e., offset) an amount from the read threshold voltage value of the center strobe, and the right strobe can be another read threshold voltage that is increased another amount from the read threshold voltage value of the center strobe.

In one implementation, the segment of the memory device is configured as quadruple level cell (QLC) memory storing four bits per cell, and the measurement method involves a parallel auto-read calibration (pARC) technique. pARC is an alternative implementation of ARC and implements the parallelization of operations.

Performing the calibration measurement of a center of a voltage valley may involve repeating the calibration measurement until the result of the calibration measurement is less than or equal to a threshold value. This means that a value that is close enough to the center of the voltage valley has been found and is expected to be used for updating the respective offset in the threshold voltage offset bin. In one example, the calibration measurement may be performed repetitively so that the result of the calibration measurement decreases each time compared with a previous time (e.g., convergence). In one implementation, a Kalman filter strategy may be used for converging of the measurement. The filtering strategy is implemented because sampling from multiple blocks (and pages) in a same bin can render variations among measurements and these measurements need to be averaged to find the appropriate read point that satisfies these measurements. In other implementations, other strategies including stochastic gradient decent, or vRLC dither criteria can be applied to achieve the convergence of the measurement. In one embodiment, the processing logic may provide a convergence flag to indicate whether to trigger a calibration measurement. For example, the processing logic may choose to reset the convergence flags for all or selected die when the temperature, workload, or other operating characteristics of the memory device have been changed significantly since the last performance of the calibration measurement.

It is noted that another (e.g., second or third) threshold criterion for triggering an offset bin update may be used in addition to the first threshold criterion or in place of the first threshold criterion. Further details regarding other threshold criterions are described with respect to FIGS. 5-6.

At operation 430, the processing logic may update a threshold voltage offset bin associated with the segment of the memory device based on a result of the calibration measurement. In one embodiment, the processing logic may update the respective offset in the threshold voltage offset bin with a value resulted from the calibration measurement. In one embodiment, bounds can be placed on the updated value. For example, there may be a relationship on the offset between each level starting with the current value, and by measuring all lower levels for a given bin, the bounds will allow a fine adjustment to each value with respect to each level with the threshold voltage offset bin. An example of a set of threshold voltage offset bins is described with respect to FIG. 3.

As described above, a threshold voltage offset bin may be determined to be associated with a segment of the memory device. In one embodiment, a threshold voltage offset bin may be associated with the segment of the memory device at the time of programming. In one example, the processing logic may associate the block family with a low threshold voltage offset bin (e.g., bin-0) at the time of programming. In another example, the processing logic may associate the block family with a threshold voltage offset bin by updating block family metadata associated with the memory device. The block family metadata can include a data structure, for example a table, which stores records, and each record in the table associates a block with the block family. In one example, the threshold voltage offset bin can be represented by the block family metadata.

In one embodiment, a threshold voltage offset bin may be associated with the segment of the memory device when the processing logic determines and/or selects a set of read level voltage offsets from a plurality of sets of read level voltage offsets such that, when applied to a base read level threshold voltage associated with the segment of the memory device, result in a suboptimal error rate not exceeding a maximum allowable error rate. The sets of read level voltage offsets can be generated when the memory sub-system is manufactured, or during usage of the memory sub-system.

It is noted that in some implementations that the threshold voltage offset bin is determined using a BFEA or similar methodology, the last valley typically will not be updated at operation 430 or the calibration measurement will not be performed for the last valley at operation 420. In other implementations that the threshold voltage offset bin is determined using a Digital Cfbyte, Dynamic vPassR, or CBC index, the last valley will be included in operations 420 and 430.

Thereafter, the updated threshold voltage offset bin will be used for a read operation. For example, when a read operation is requested, the processing device may identify, based on metadata associated with the memory device, the segment of the memory device associated with the physical address. The processing device may then utilize the offset table 301 of FIG. 3 in order to determine the threshold voltage offsets for the identified threshold voltage offset bin. The processing device may compute a modified threshold voltage by applying the identified threshold voltage offset to a base read level voltage associated with the memory device. The base read level voltage can be stored in the metadata area of the memory device. The processing device may utilize the computed modified threshold voltage in order to perform the requested read operation.

Figure 5:
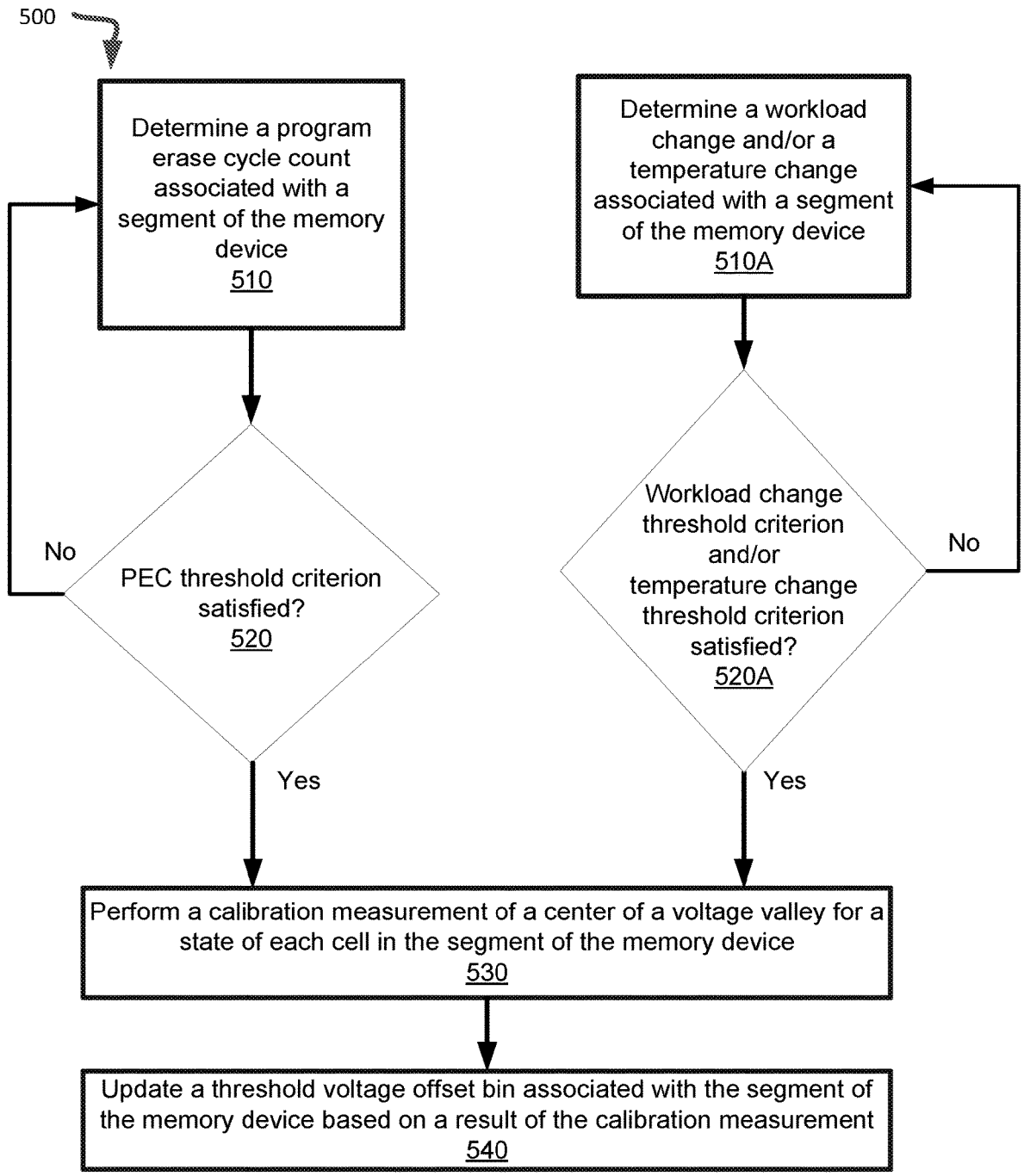

FIG. 5 is a flow diagram of an example method 500 to update read level voltage offsets for a threshold voltage offset bin, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the offset bin update component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic may determine a program erase cycle (PEC) count associated with a segment of the memory device, and at operation 520, the processing logic may determine whether a PEC threshold criterion is satisfied for triggering an offset bin update. The operations 510 and 520 may be same as or similar to the operation 410.

At operation 510A, the processing logic may determine a workload change and/or a temperature change associated with a segment of the memory device, and at operation 520A, the processing logic may determine whether a workload change threshold criterion and/or a temperature change threshold criterion is satisfied for triggering an offset bin update.

In some embodiments, the processing logic may determine the workload change for a set of target cells. A set of target cells may be defined to have the same workload change. In one embodiment, memory sub-system controller 115 tracks the workload change at a certain level of granularity, such as by segment, by memory die, by memory device, etc. Accordingly, offset bin update component 113 can retrieve the workload change associated with the segment of the memory device including the target cells, such as from a data structure maintained in local memory 119 or elsewhere on memory device 130. For example, the processing logic may determine the workload change when a request for any or certain operation is received. In one implementation, the processing logic may obtain information from the request regarding workload to calculate a value representing the workload change. In another implementation, the processing logic may extract information from metadata regarding the operation to obtain a value representing the workload change.

In one embodiment, the processing logic may compare the workload change with a threshold value. In one implementation, the workload change satisfies the threshold criterion when the workload change is greater than or equal to the threshold value. In another implementation, the threshold criterion may include a range of values, and the workload change satisfies the threshold criterion when the workload change falls in the range.

In some embodiments, the processing logic may determine the temperature change for a set of target cells. A set of target cells may be defined to have the same temperature change. In one embodiment, memory sub-system controller 115 tracks the temperature change at a certain level of granularity, such as by segment, by memory die, by memory device, etc. Accordingly, offset bin update component 113 can retrieve the temperature change associated with the segment of the memory device including the target cells, such as from a data structure maintained in local memory 119 or elsewhere on memory device 130. For example, the processing logic may determine the write temperature at a time when the request to perform the programming operation is received. Depending on the embodiment, the processing logic may determine a current temperature by either querying temperature sensor for a new temperature measurement in response to receiving a request (e.g., a read request), or using a most recently measured temperature value (e.g., when temperature measurements are routinely taken at periodic intervals on memory device 130). In one example, the processing logic may determine a temperature change for the segment of the memory device by calculating a difference between the write temperature and the current temperature. In one embodiment, the processing logic may obtain a temperature measurement value from a temperature sensor on the memory device 130 (i.e., an on-die temperature sensor). In another embodiment, the control logic may receive a temperature measurement value from a temperature sensor external to the memory device, such as a sensor located elsewhere in memory sub-system 110.

In one embodiment, the processing logic may compare the temperature change with a threshold value. In one implementation, the temperature change satisfies the threshold criterion when the temperature change is greater than or equal to the threshold value. In another implementation, the threshold criterion may include a range of values, and the temperature change satisfies the threshold criterion when the temperature change falls in the range.

At operation 530, responsive to determining that the PEC threshold criterion is satisfied at operation 520 or the workload change threshold criterion and/or the temperature change threshold criterion is satisfied at operation 520A, the processing logic may perform a calibration measurement of a center of a voltage valley for a state of each cell in the segment of the memory device. The operation 530 may be same as or similar to the operation 420 regarding the performance of the calibration measurement.

At operation 540, the processing logic may update a threshold voltage offset bin associated with the segment of the memory device based on a result of the calibration measurement. The operation 540 may be same as or similar to the operation 430.

FIG. 6 is a flow diagram of an example method 600 to update read level voltage offsets for a threshold voltage offset bin, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the offset bin update component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic may determine whether a parameter associated with a segment of the memory device satisfies a threshold criterion for triggering an offset bin update. In one embodiment, the parameter associated with the segment of the memory device may be the PEC count, and the related operations may be same as or similar to the operation 410. In one embodiment, the parameter associated with the segment of the memory device may be the workload change or the temperature change, the related operations may be same as or similar to the operations 510A and 520A. In one embodiment, the parameter associated with the segment of the memory device may include the PEC count, the workload change, the temperature change, or any combination thereof, and the related operations may be same as or similar to the operations 410, 510A, 520A, or combination, accordingly.

At operation 620, responsive to determining that the parameter associated with the segment of the memory device satisfies the threshold criterion, the processing logic may perform a calibration measurement of a center of a voltage valley for a state of each cell in the segment of the memory device. The operation 620 may be same as or similar to the operation 420 regarding the performance of the calibration measurement.

At operation 630, the processing logic may update a threshold voltage offset bin associated with the segment of the memory device based on a result of the calibration measurement. The operation 630 may be same as or similar to the operation 430.

Figure 7:
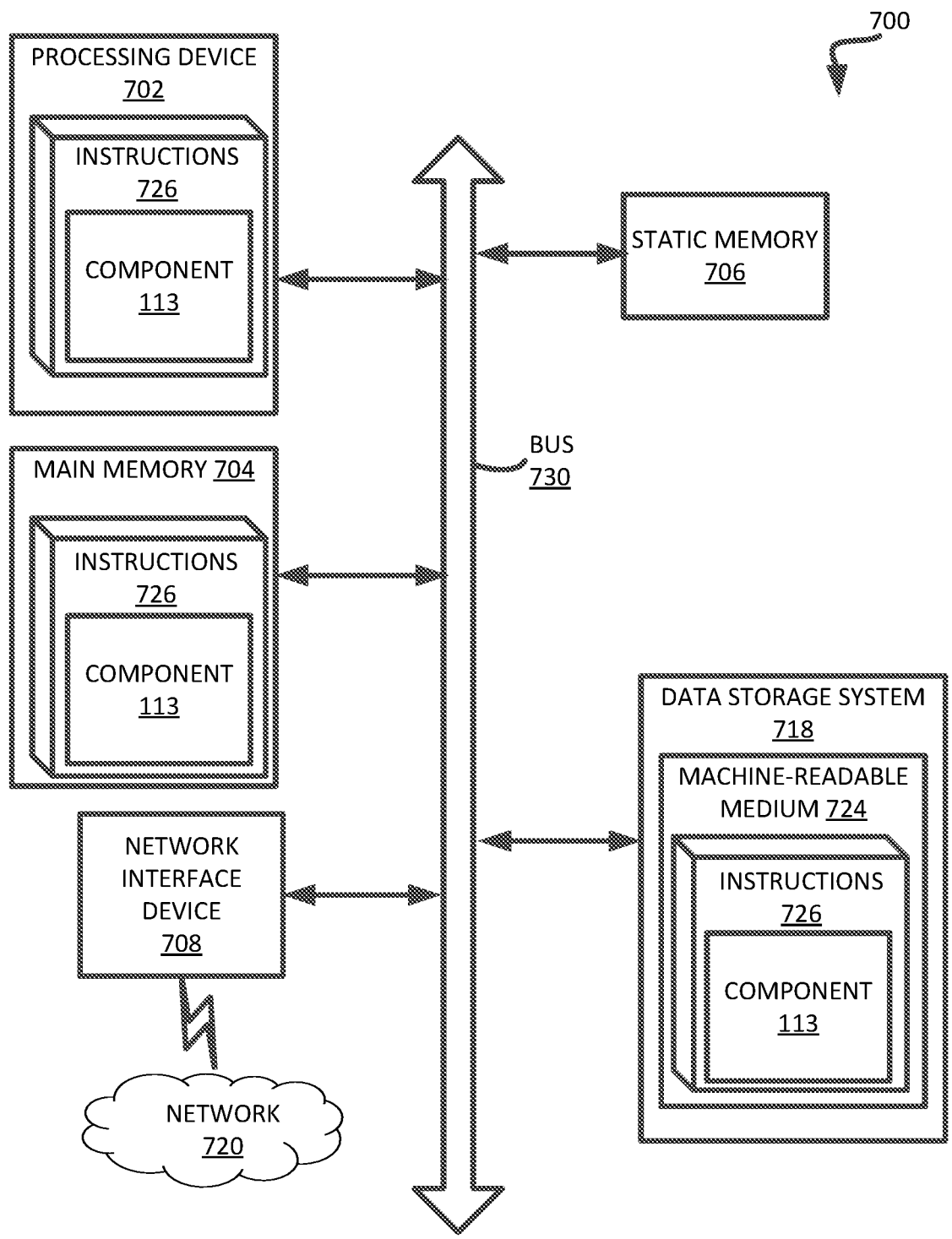
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the offset bin update component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to an offset bin update component (e.g., the offset bin update component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        determining whether a program erase cycle count associated with a segment of the memory device satisfies a first threshold criterion for triggering an offset bin update;
        responsive to determining that the program erase cycle count satisfies the first threshold criterion, performing a calibration measurement of a center of a voltage valley for each state of each cell in the segment of the memory device;
        repeating the calibration until a result of the calibration measurement is less than or equal to a threshold value; and
        updating a threshold voltage offset bin associated with the segment of the memory device based on the result of the calibration measurement.

2. The system of claim 1, wherein the processing device is to perform operations further comprising:
    determining whether a workload change satisfies a second threshold criterion for triggering the offset bin update; and responsive to determining that the workload change satisfies the second threshold criterion, performing the calibration measurement.

3. The system of claim 1, wherein the processing device is to perform operations further comprising:
determining whether a temperature change satisfies a third threshold criterion for triggering the offset bin update; and
responsive to determining that the temperature change satisfies the third threshold criterion, performing the calibration measurement.

4. The system of claim 1, wherein
the result of the calibration measurement decreases each time compared with a previous time.

5. The system of claim 1, wherein a technique associated with performing the calibration measurement is selected based on a number of bits per cell which the segment of the memory device is configured to store.

6. The system of claim 5, wherein the segment of the memory device is configured as triple level cell (TLC) memory storing three bits per cell, and wherein the technique comprises an auto-read calibration (ARC) technique and a vectorized read level calibration (vRLC) technique with read sample offsets (RSOs).

7. The system of claim 5, wherein the segment of the memory device is configured as quadruple level cell (QLC) memory storing four bits per cell, and wherein the technique comprises a parallel auto-read calibration (pARC) technique.

8. The system of claim 1, wherein performing the calibration measurement comprises:
responsive to the threshold voltage offset bin being determined by a specific method, skipping the calibration measurement of the center of the voltage valley for a highest state of each cell.

9. A method comprising:
determining, by a processing device, whether a program erase cycle count associated with a segment of a memory device satisfies a first threshold criterion for triggering an offset bin update;
responsive to determining that the program erase cycle count satisfies the first threshold criterion, performing a calibration measurement of a center of a voltage valley for a state of each cell in the segment of the memory device;
performing the calibration measurement repetitively so that a result of the calibration measurement decreases each time compared with a previous time; and
updating a threshold voltage offset bin associated with the segment of the memory device based on the result of the calibration measurement.

10. The method of claim 9, further comprising:
determining whether a workload change satisfies a second threshold criterion for triggering an offset bin update; and
responsive to determining that the workload change satisfies the second threshold criterion, performing the calibration measurement.

11. The method of claim 9, further comprising:
determining whether a temperature change satisfies a third threshold criterion for triggering an offset bin update; and
responsive to determining that the temperature change satisfies the third threshold criterion, performing the calibration measurement.

12. The method of claim 9,
wherein the result of the calibration measurement is less than or equal to a threshold value.

13. The method of claim 9, further comprising:
performing the calibration measurement for each of a plurality of states of each cell in the segment of the memory device.

14. A non-transitory computer-readable storage medium comprising instructions that, when executed by a processing device, cause the processing device to perform operations comprising:
determining whether a parameter associated with a segment of a memory device satisfies a threshold criterion for triggering an offset bin update;
responsive to determining that the parameter satisfies the threshold criterion, performing a calibration measurement of a center of a voltage valley for each state of each cell in the segment of the memory device, wherein a technique associated with performing the calibration measurement is selected based on a number of bits per cell which the segment of the memory device is configured to store; and
updating a threshold voltage offset bin associated with the segment of the memory device based on a result of the calibration measurement.

15. The non-transitory computer-readable storage medium of claim 14, wherein determining whether the parameter associated with the segment of the memory device satisfies the threshold criterion further comprises:
determining whether a program erase cycle count associated with the segment of the memory device satisfies a first threshold criterion.

16. The non-transitory computer-readable storage medium of claim 14, wherein determining whether the parameter associated with the segment of the memory device satisfies the threshold criterion further comprises:
determining whether a workload change associated with the segment of the memory device satisfies a second threshold criterion.

17. The non-transitory computer-readable storage medium of claim 14, wherein determining whether the parameter associated with the segment of the memory device satisfies the threshold criterion further comprises:
determining whether a temperature change associated with the segment of the memory device satisfies a third threshold criterion.

18. The non-transitory computer-readable storage medium of claim 14, further comprises:
repeating the calibration measurement until the result of the calibration measurement is less than or equal to a threshold value.

19. The non-transitory computer-readable storage medium of claim 14, wherein the segment of the memory device is configured as triple level cell (TLC) memory storing three bits per cell, and wherein the technique comprises an auto-read calibration (ARC) technique and a vectorized read level calibration (vRLC) technique with read sample offsets (RSOs).

20. The non-transitory computer-readable storage medium of claim 14, wherein the segment of the memory device is configured as quadruple level cell (QLC) memory storing four bits per cell, and wherein the technique comprises a parallel auto-read calibration (pARC) technique.

* * * * *